(12) United States Patent
Choi et al.

(10) Patent No.: US 9,079,244 B2
(45) Date of Patent: Jul. 14, 2015

(54) METHOD FOR DISPERSING NANOPARTICLES AND METHODS FOR PRODUCING NANOPARTICLE THIN FILMS BY USING THE SAME

(75) Inventors: Seong Jae Choi, Gyeonggi-do (KR); Jae Young Choi, Gyeonggi-do (KR); Eun Joo Jang, Gyeonggi-do (KR); Bulliard Xavier, Seoul (KR); Yu Jin Kang, Seoul (KR); Wan Ki Bae, Seoul (KR); Kook Heon Char, Seoul (KR)

(73) Assignees: SAMSUNG ELECTRONICS CO., LTD. (KR); SEOUL NATIONAL UNIVERSITY INDUSTRY FOUNDATION (KR)

( * ) Notice: Subject to any disclaimer, the term of this patent is extended or adjusted under 35 U.S.C. 154(b) by 951 days.

(21) Appl. No.: 11/696,451

(22) Filed: Apr. 4, 2007

(65) Prior Publication Data
US 2008/0102201 A1    May 1, 2008

(30) Foreign Application Priority Data

Oct. 30, 2006  (KR) .................. 10-2006-0105648

(51) Int. Cl.
| | |
|---|---|
| B05D 1/04 | (2006.01) |
| H05C 1/00 | (2006.01) |
| B22F 1/00 | (2006.01) |
| H01L 51/00 | (2006.01) |

(52) U.S. Cl.
CPC ........... *B22F 1/0088* (2013.01); *B22F 2998/00* (2013.01); *H01L 51/0036* (2013.01); *Y10T 428/268* (2015.01)

(58) Field of Classification Search
USPC .......................................... 427/430.1, 58, 21
See application file for complete search history.

(56) References Cited

U.S. PATENT DOCUMENTS

| 4,733,009 | A  * | 3/1988  | Miyahara et al. ............. 562/554 |
|---|---|---|---|
| 2003/0026898 | A1 * | 2/2003  | Hong et al. .................... 427/240 |
| 2004/0250750 | A1 * | 12/2004 | Reda et al. ...................... 117/84 |
| 2005/0003187 | A1 * | 1/2005  | Adams et al. ................. 428/402 |
| 2006/0032755 | A1 * | 2/2006  | Herman et al. ............... 205/109 |
| 2006/0046480 | A1 * | 3/2006  | Guo ............................. 438/685 |
| 2007/0077351 | A1 * | 4/2007  | Chen et al. .................... 427/212 |
| 2008/0099803 | A1 * | 5/2008  | Li et al. ......................... 257/291 |
| 2008/0199626 | A1 * | 8/2008  | Zhou et al. ................. 427/430.1 |

OTHER PUBLICATIONS

"Basics of Centrifugation" reprinted by THERMO (Aug. 2006).*
Kim, et al.; "Synthesis of Monodisperse Palladium Nanoparticles"; Nano Letters; 3; pp. 1289-1291; (2003).

* cited by examiner

*Primary Examiner* — Austin Murata
(74) *Attorney, Agent, or Firm* — Cantor Colburn LLP

(57) ABSTRACT

Methods for producing nanoparticle thin films are disclosed. According to one of the methods, a nanoparticle thin film is produced by modifying the surface of nanoparticles to allow the nanoparticles to be charged, controlling an electrostatic attractive force between the charged nanoparticles and a substrate and a repulsive force between the individual nanoparticles by a variation in pH to control the number density of the nanoparticles arranged on the substrate.

10 Claims, 8 Drawing Sheets

METHOD FOR DISPERSING NANOPARTICLES AND METHODS FOR PRODUCING NANOPARTICLE THIN FILMS BY USING THE SAME

This non-provisional application claims priority under 35 U.S.C. §119(a) on Korean Patent Application No. 2006-105648 filed on Oct. 30, 2006, which is hereby incorporated in its entirety by reference.

BACKGROUND OF THE INVENTION

1. Field of the Invention

The present invention relates to a method for dispersing nanoparticles. It also relates to a method for producing nanoparticle thin films by utilizing the dispersed nanoparticles. More specifically, the present invention relates to a method for producing a nanoparticle thin film in which the surface of nanoparticles is modified to allow the nanoparticles to be charged. An electrostatic attractive force between the charged nanoparticles and a substrate and a repulsive force between the individual nanoparticles is controlled by a variation in pH to control the number density of the nanoparticles arranged on the substrate. In addition, a capillary force other than the electrostatic forces is introduced during the arrangement of the nanoparticles to form a high-density and uniform nanoparticle monolayer in a large area on the substrate.

2. Description of Related Art

Recently, research has been conducted to use nanoparticles in various industrial applications, such as memory devices with maximized memory capacity. Nanoparticles are also used in light-emitting devices utilizing the luminescence of nanoparticles due to quantum confinement effects. However, since nanoparticles have a strong tendency toward aggregation between the individual nanoparticles, they do not disperse easily. Various methods have been attempted to improve the dispersibility of nanoparticles without aggregation in media.

Certain techniques have been known to improve the dispersibility of nanoparticles by displacing materials coordinated to the surface of other nanoparticles. For example, sonication and filtration using a column or a filter have been employed to separate nanoparticle aggregates. However, when sonication is applied to separate nanoparticle aggregates for a long period of time, high ultrasonic energy used during the sonication results in the destruction of nanoparticles or causes the occurrence of defects of nanoparticles. If the reaction time is shortened in order to prevent the occurrence of defects, some reactants remain unreacted and the yield becomes low.

In addition, when aggregated particles are separated from each other using a column or a filter, a high water pressure has to be applied to the filter for a long time and the nanoparticles are adsorbed to the filter, resulting in a loss of the nanoparticles. Accordingly, these separation processes are unsuitable for mass production of nanoparticles without aggregation.

Langmuir-Blodgett (LB) technique wherein a film is formed at the interface between an aqueous solution and air is another technique for producing nanoparticle thin films. However, since this technique utilizes weak van der Waals interactions between individual particles or between particles and the substrate, the transfer ratio, which is defined as the percentage of the number of the particles transferred to the substrate, is usually never higher than 1. Accordingly, the Langmuir-Blodgett technique is not suitable for the formation of uniform monolayers in large areas. Electrostatic self assembly technique is also used for producing nanoparticle thin films. According to this technique, nanoparticles and a substrate oppositely charged to the nanoparticles are used to produce a thin film. However, this technique causes the aggregation of nanoparticles in its practical use, which results in the occurrence of defects and low degree of completeness.

Pyrolysis, laser ablation and chemical vapor deposition (CVD) techniques are also used to produce nanoparticle thin films. According to these techniques, nanoparticles are directly formed on a substrate through a vapor phase reaction of raw materials supplied in a gaseous state, followed by sequential deposition and growth to arrange the nanoparticles on the substrate. However, these techniques have problems in that a uniform monolayer having a density as high as $10^{11}$ nanoparticles/cm$^2$ cannot be formed in a large area.

Thus, there is a need for a nanoparticle thin film that has a large surface area and is in the form of a uniform monolayer. It is also desirable for the nanoparticle thin film to have a high-density of nanoparticles.

SUMMARY OF THE INVENTION

In one embodiment, the present invention provides a method for dispersing nanoparticles by modifying the surface of nanoparticles to allow the nanoparticles to be charged and adjusting the pH of an aqueous dispersion of the charged nanoparticles to control the number density of the nanoparticles arranged upon the surface of a substrate.

In another embodiment, the present invention provides a method for producing a nanoparticle thin film by controlling electrostatic forces between the substrate and nanoparticles and between the individual nanoparticles to form a nanoparticle monolayer in which the nanoparticles are arranged at a high density without any substantial aggregation.

In another embodiment, the present invention provides a method for producing a nanoparticle thin film by utilizing a capillary force that excludes electrostatic forces to provide a uniform and high-density nanoparticle monolayer in which nanoparticles are closely arranged without any aggregation during arrangement of the nanoparticles.

In yet another embodiment, the present invention provides a nanoparticle thin film comprising a nanoparticle monolayer formed by one of the aforementioned methods.

In yet another embodiment, the present invention provides an electronic device comprising the nanoparticle thin film.

In addition, there is provided a method for dispersing nanoparticles, the method comprising the steps of (a) modifying the surface of nanoparticles to allow the surface of the nanoparticles to be charged, and (b) dispersing the surface-modified nanoparticles in a solvent and adjusting the pH of the nanoparticle dispersion.

In accordance with another aspect of the present invention, there is provided a method for producing a nanoparticle thin film, the method comprising the steps of coating a substrate with a pH-controlled nanoparticle dispersion prepared by the dispersion method.

In accordance with another aspect of the present invention, there is provided a method for producing a nanoparticle thin film, the method comprising the steps of (a) modifying the surface of nanoparticles to allow the surface of the nanoparticles to be charged, (b) dispersing the surface-modified nanoparticles in a solvent and adjusting the pH of the nanoparticle dispersion, and (c) arranging the nanoparticles contained in the pH-controlled nanoparticle dispersion on a substrate by utilizing a capillary force to form a nanoparticle monolayer on the substrate.

In accordance with another aspect of the present invention, there is provided a nanoparticle thin film which comprises a nanoparticle monolayer formed by one of the methods.

In accordance with yet another aspect of the present invention, there is provided an electronic device comprising the nanoparticle thin film.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in greater detail with reference to the accompanying drawings.

In one aspect, the present invention is directed to a method for dispersing nanoparticles, the method comprising the steps of (a) modifying the surface of nanoparticles to allow the surface of the nanoparticles to be charged, and (b) dispersing the surface-modified nanoparticles in a solvent and adjusting the pH of the nanoparticle dispersion. An explanation of the respective steps of the method according to the present invention will be provided below.

(a) Surface Modification of Nanoparticles

The surface of nanoparticles may be modified by exchanging nonpolar capping molecules on the surface of nanoparticles for charged materials or adsorbing charged materials on the surface of the nanoparticles.

Any kind of nanoparticles that can be prepared by common synthesis techniques may be used in the present invention. Examples of such nanoparticles include nanoparticles prepared by organometallic chemical vapor deposition, molecular beam epitaxy, wet chemistry synthesis, or the like, or a combination comprising at least one of the foregoing nanoparticles.

Non-limiting specific examples of such nanoparticles include Group II-IV compound semiconductor particles, Group III-V compound semiconductor particles, Group IV-VI compound semiconductor particles, Group IV compound semiconductor particles, metal particles, magnetic particles and metal oxide nanoparticles. Preferred nanoparticles include those of CdS, CdSe, CdTe, ZnS, ZnSe, ZnTe, GaN, GaP, GaAs, GaSb, AlN, AlP, AlAs, AlSb, InP, InAs, InSb, SiC, Fe, Pt, Ni, Co, Al, Ag, Au, Cu, CoPt, FePt, $Fe_2O_3$, $Fe_3O_4$, Si, Ge, Pd, $TiO_2$, $ZrO_2$, $SiO_2$, $Al_2O_3$, ZnO, or the like, or a combination comprising at least one of the foregoing particles.

Core-shell structured alloy nanoparticles may be used in the method of the present invention. The size of nanoparticles that can be used in the method of the present invention is not especially limited to, and is preferably in the range of about 2 nanometers (nm) to about 30 nm.

The charged material used to modify the surface of the nanoparticles can be selected from the group consisting of compounds having an amino group, a carboxylic group, a mercapto group, or a phosphine group and having negative or positive charge. Specific examples of such charged materials include, but are not limited to, mercaptoacetic acid (MAA), 3-mercaptopropionic acid, cysteamine, aminoethanethiol, N,N-dimethyl-2-mercaptoethyl ammonium, or the like, or a combination comprising at least one of the foregoing charged materials. The surface modification is preferably performed at a reaction temperature of about 25 to about 200° C. for about 0.5 to about 10 hours and more preferably about 1 to about 10 hours.

After completion of the reaction, precipitation and centrifugation can be alternately conducted to wash the nanoparticle solution. The precipitation and the centrifugation can be repeated if desired. This repeated procedure is to remove residues and impurities remaining in the nanoparticle solution. Specifically, the washing is carried out by repeating the dispersion and precipitation of the nanoparticle solution in an organic solvent. It is preferred to repeat the washing procedure three to ten times to achieve sufficient washing of the nanoparticle solution.

It is desirable to dry the washed nanoparticles in ambient air or under vacuum to remove the remaining solvent. Particularly, when the washed nanoparticles are dried under vacuum, aggregation of the nanoparticles can be effectively prevented. For sufficient removal of the remaining solvent, the drying is preferably performed under vacuum for about 1 to about 12 hours. After removal of the remaining solvent, the dried nanoparticles are dispersed in a solvent, for example, water or a tris(hydromethyl)aminomethane (Tris) buffer. The dispersion thus obtained contains nanoparticle aggregates and impurities other than the surface-modified nanoparticles. Column techniques, filtration and centrifugation can be employed to remove the nanoparticle aggregates and impurities from the dispersion. Centrifugation is preferred.

In the method of the present invention, centrifugation is employed to selectively precipitate the nanoparticle aggregates from the other particles dispersed in the nanoparticle dispersion. The centrifugation is preferably performed at about 4,000 to about 50,000 g (corresponding to about 4,000 to about 35,000 rpm) for about 1 minute to about 3 hours and more preferably about 4,000 to about 30,000 g (corresponding to about 4,000 to about 15,000 rpm) for about 1 minute to about 1 hour.

(b) pH Adjustment of Nanoparticle Dispersion

The surface-modified nanoparticles are dispersed in a solvent. Then, a pH-controlled buffer solution is mixed with the nanoparticle dispersion to adjust the pH of the nanoparticle dispersion. The pH-controlled nanoparticle dispersion is used to produce a nanoparticle thin film.

Any solvent that is capable of promoting a change in the pH of the nanoparticle dispersion may be used to disperse the nanoparticles, and examples thereof include, but are not particularly limited to, water, polar solvents, or a combination thereof. The nanoparticle dispersion may have a pH range of about 7 to about 9 and preferably about 7 to about 8.

Figure 1:
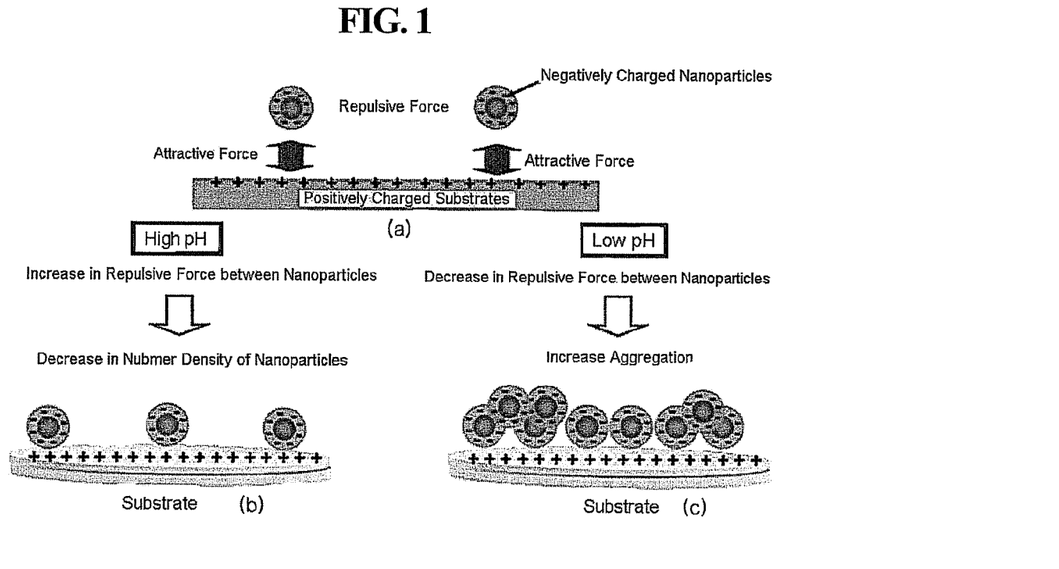
FIG. 1 depicts an exemplary schematic diagram that illustrates the production of nanoparticle thin films by varying pH values in accordance with a method of the present invention.

The surface-charged nanoparticles can be used with a substrate that bears a charge opposite from those of the nanoparticles to produce a nanoparticle thin film. As shown in FIG. 1, a repulsive force is created between the equally charged individual nanoparticles, and an attractive force is created between the nanoparticles and the substrate. As a result, a balance between the two electrostatic forces allows the nanoparticles to be arranged in a desired manner on the substrate (see, (a) in FIG. 1).

The pH of the nanoparticle dispersion can be used to vary the spacing of the nanoparticles on the surface of the substrate. In the case where the pH of the nanoparticle dispersion is low, the repulsive force between the individual nanoparticles decreases, resulting in closer arrangement of the nanoparticles on the substrate than if the pH were higher. However, when the nanoparticle dispersion has a pH value lower than the optimal value, a repulsive force between the individual nanoparticles considerably decreases, and as a result, the nanoparticles are too closely arranged on the substrate, causing aggregation of the nanoparticles (see, (c) in FIG. 1). In contrast, in the case where the pH of the nanoparticle dispersion is high, a repulsive force between the individual nanoparticles increases, minimizing aggregation of the nanoparticles. This leads to a lower number density of the nanoparticles arranged on the substrate. Thus, it is desirable to adjust the pH of the nanoparticle dispersion to a value suitable to produce a high-density nanoparticle monolayer without any aggregation.

In another aspect, the present invention is directed to a method for producing a nanoparticle thin film which comprises the step of coating a substrate with a pH-controlled nanoparticle dispersion prepared by the dispersion method.

According to the method of the present invention, a nanoparticle thin film is produced by coating a pretreated substrate with the pH-controlled nanoparticle dispersion.

The pretreated substrate is prepared by washing a substrate and introducing a functional group to the surface of the washed substrate. The kind of the functional groups present on the surface of the substrate is not especially restricted so long as the surface of the substrate is charged with a charge that is opposed to the charge on the nanoparticles. Examples of suitable functional groups include acidic groups (e.g., ammonium) and basic groups (e.g., amine).

As the substrate on which a nanoparticle monolayer is to be formed, there can be used, without limitation, glass, ITO glass, quartz, a silicon (Si) wafer, a silica-coated substrate, an alumina-coated substrate, or the like, or a combination comprising at least one of the foregoing substrates.

The coating of the nanoparticle dispersion can be performed, without any particular limitation, by drop casting, spin coating, dip coating, spray coating, flow coating, screen printing, or the like, or a combination comprising at least one of the foregoing substrates.

In another aspect, the present invention is directed to a method for producing a nanoparticle thin film, the method comprising the steps of (a) modifying the surface of nanoparticles to allow the surface of the nanoparticles to be charged, (b) dispersing the surface-modified nanoparticles in a solvent and adjusting the pH of the nanoparticle dispersion, and (c) arranging the nanoparticles contained in the pH-controlled nanoparticle dispersion on a substrate by utilizing a capillary force to form a nanoparticle monolayer on the substrate.

According to the method of the present invention, a nanoparticle thin film is formed by modifying the surface of nanoparticles to allow the nanoparticles to be charged, dispersing the surface-modified nanoparticles in a solvent, adjusting the pH of the nanoparticle dispersion, and arranging the nanoparticles contained in the pH-controlled nanoparticle dispersion on a substrate by utilizing a capillary force to form a high-density nanoparticle monolayer on the substrate.

The arrangement of the nanoparticles to form a monolayer on a substrate is accomplished by dip coating or by using a special apparatus for the introduction of a capillary force.

Figure 2A:
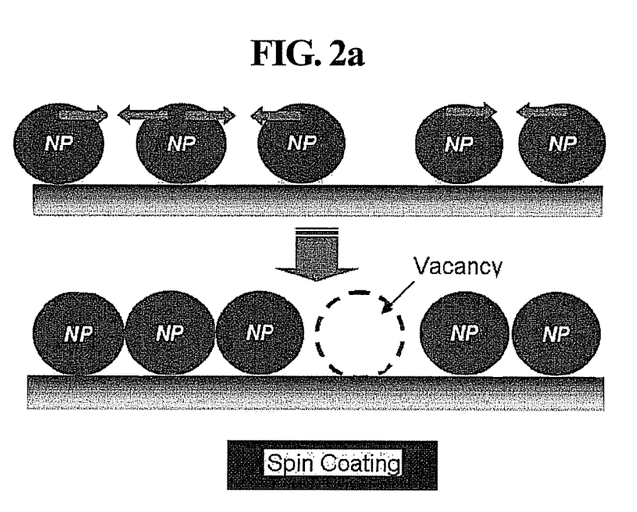
FIG. 2a depicts an exemplary schematic diagram that illustrates the production of a nanoparticle thin film in accordance with a conventional method.
Figure 2B:
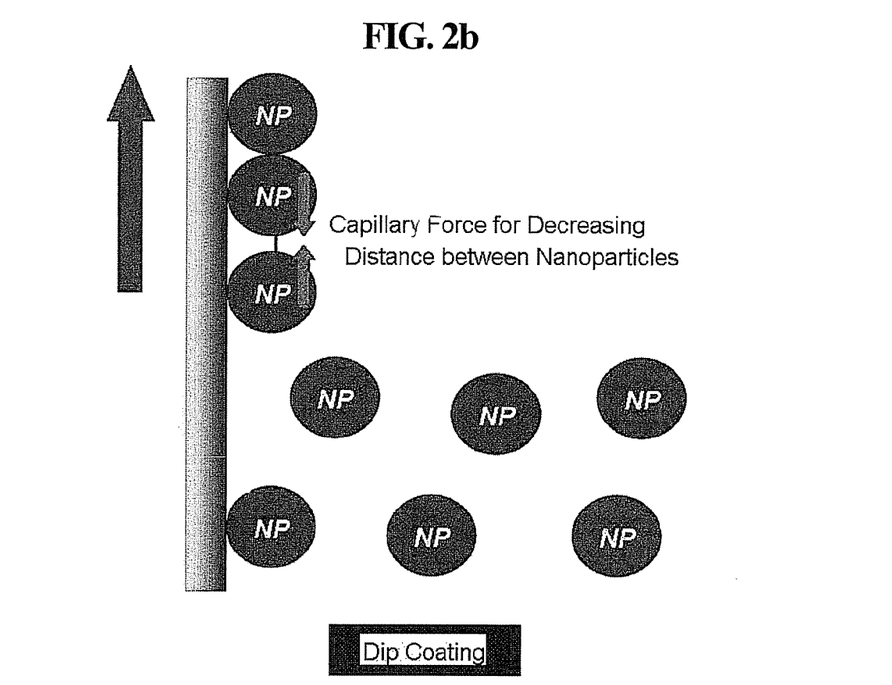
FIG. 2b depicts an exemplary schematic diagram that illustrates the production of a nanoparticle thin film by utilizing a capillary force in accordance with an embodiment of the present invention.

When nanoparticles are arranged by a conventional method, a repulsive force between the individual nanoparticles are aggregated and hence are not arranged on a substrate in the form of a monolayer (FIG. 2a). In contrast, when the nanoparticles are arranged by utilizing a capillary force, the capillary force is created along the surface of the substrate to allow the nanoparticles to be arranged without any defect, resulting in an increase in the number density of the nanoparticles arranged on the substrate.

In another aspect, the present invention is directed to a nanoparticle thin film, which comprises a nanoparticle monolayer formed by one of the methods.

In yet another aspect, the present invention is directed to an electronic device comprising the nanoparticle thin film.

Since the nanoparticle thin film of the present invention has a high number density of nanoparticles and contains few nanoparticle aggregates, it can be uniformly formed into a monolayer in an area larger than 1 millimeter (mm)×1 mm. Accordingly, the nanoparticle thin film of the present invention can be applied to 300-mm wafers or larger, which are used in semiconductor manufacturing processes.

Since the nanoparticle thin film of the present invention comprises a high-density and uniform nanoparticle monolayer formed on a substrate, it can be effectively applied to a variety of electronic devices, including flash memories, dynamic random access memories (DRAMs), hard disks, light-emitting devices and organic light-emitting diodes (OLEDs).

Hereinafter, the present invention will be explained in more detail with reference to the following examples. However, these examples are given for the purpose of illustration only and are not intended to limit the present invention.

EXAMPLE 1

Surface Modification and Dispersion of Nanoparticles 1 mL of mercaptoacetic acid was slowly added dropwise to 10 mL of a dispersion of palladium (Pd) nanoparticles (0.1 wt %) in toluene under a nitrogen atmosphere. The mixture was reacted while stirring rapidly for 4 hours. The reaction temperature was maintained at 100° C. to modify the surface of the Pd nanoparticles. As a result of the reaction, the surface of the Pd nanoparticles was negatively charged. The Pd nanoparticles were not readily dispersed in the toluene as the reaction proceeded. After completion of the reaction, the reaction mixture was centrifuged at 9,000 rpm for 5 minutes to separate a precipitate of the nanoparticles.

The precipitated nanoparticles were re-dispersed in chloroform by sonication and centrifuged at 9,000 rpm for 5 minutes to wash the precipitated nanoparticles. The series of re-dispersion and centrifugation was repeated five times or more to remove the unreacted mercaptoacetic acid. The washed nanoparticles were sufficiently dried at room temperature to remove the chloroform and dispersed in a buffer solution (pH>7).

The dispersion of the Pd nanoparticles surface-modified with the mercaptoacetic acid was centrifuged at 9,000 rpm for 10 minutes to remove nanoparticle aggregates.

EXAMPLE 2 pH Adjustment of Nanoparticle Dispersions

The Pd nanoparticles surface-modified with the mercaptoacetic acid, which were prepared in Example 1, were dispersed in Tris buffer solutions having different pH values of 7.0, 7.4, 7.8, 8.2, 8.6 and 9.0. The respective pH-controlled Tris buffer solutions were prepared by adding appropriate amounts of a 0.1 M HCl solution to 0.1 M Tris buffer solutions. The pH values of the pH-controlled Tris buffers were determined using a pH meter.

EXAMPLE 3

Formation of Nanoparticle Monolayers

Silicon wafer substrates were dipped in a piranha solution ($H_2SO_4:H_2O_2$ 1:3 (volume/volume) (v/v)), ultrasonicated for 15 minutes, washed with methanol/toluene, ultrasonicated in an RCA solution ($NH_4OH:H_2O_2:H_2O$=1:1:5 (v/v/v)) at 70° C. for 10 minutes, and sufficiently washed with methanol using distilled water.

A 10 millimolar (mM) aqueous solution of polyallylamine hydrochloride (PAH, $M_w$=70,000) was spin-coated at 5,000 revolutions per minute (rpm) on the washed substrates for 30 seconds. The PAH-coated substrates were baked at 150° C. for 10 minutes, and then the respective nanoparticle dispersions having different pH values prepared in Example 2 were spin-coated thereon at 3,000 rpm for 30 seconds to form nanoparticle monolayers. The spin coating was conducted three times and washed using distilled water. The number density of the nanoparticles in each of the nanoparticle monolayers was observed under a scanning electron microscope (SEM). The results are shown in FIGS. 3 and 4.

Figure 3:
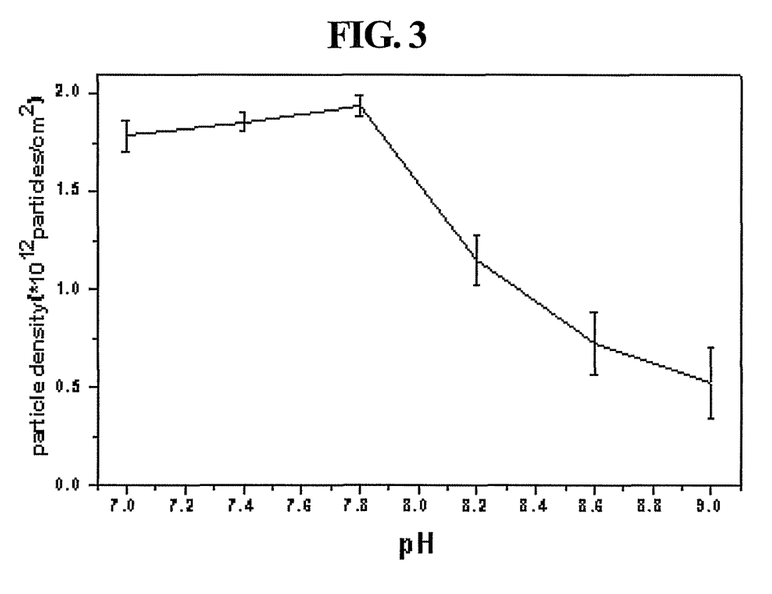
FIG. 3 is a graph showing variations in the number density of nanoparticles in nanoparticle monolayers, which are formed by applying nanoparticle dispersions having different pH values to respective substrates in Example 3 of the present invention.

FIG. 3 is a graph showing variations in the number density of the nanoparticles in the nanoparticle monolayers, which were formed by applying the nanoparticle dispersions having different pH values to the respective substrates in Example 3. The graph shows that the number density values of the nanoparticles in the nanoparticle monolayers were different with varying pH values.

Figure 4:
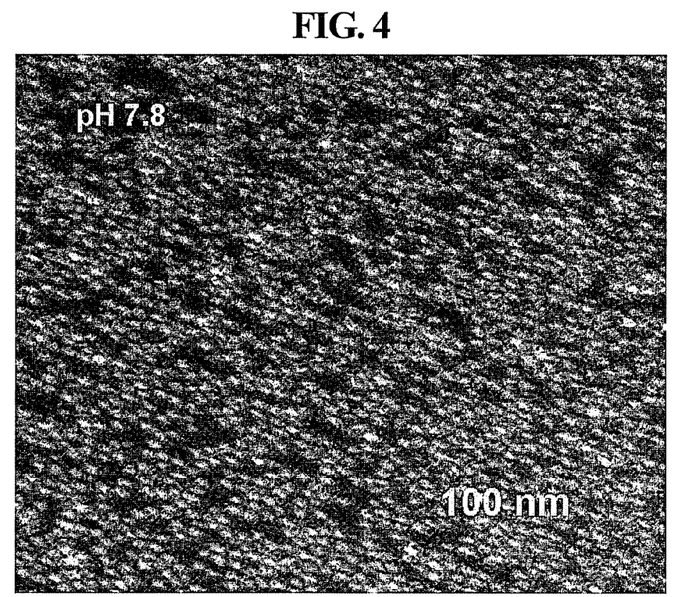
FIG. 4 is a scanning electron micrograph (SEM) showing nanoparticles arranged in a nanoparticle monolayer, which is formed by applying a nanoparticle dispersion to a substrate in Example 3 of the present invention.

FIG. 4 is a scanning electron micrograph (SEM) showing a state of the nanoparticles arranged in the nanoparticle monolayer, which was formed by applying the nanoparticle dispersion having a pH of 7.8 to the corresponding substrate in Example 3. The micrograph shows that no aggregation of the nanoparticles on the substrate was observed and the number density of the nanoparticles arranged on the substrate was about $1.8 \times 10^{12}$ NPs/cm$^2$, which corresponds to 76% of the theoretical maximum number density of nanoparticles.

EXAMPLE 4

Production of Nanoparticle Thin Film by Utilizing Capillary Force

Dip coating was employed to arrange the nanoparticles contained in the nanoparticle dispersion having a pH of 7.8 prepared in Example 2 by a capillary phenomenon.

A silicon wafer substrate was dipped in a piranha solution ($H_2SO_4:H_2O_2$=1:3 (v/v)), ultrasonicated for 15 minutes, washed with methanol/toluene, ultrasonicated in an RCA solution ($NH_4OH:H_2O_2:H_2O$=1:1:5 (v/v/v)) at 70° C. for 10 minutes, and sufficiently washed with methanol using distilled water.

A 10 mM aqueous solution of polyallylamine hydrochloride (PAH, $M_w$=70,000) was subjected to spin-coating at 5,000 rpm for 30 seconds. The spin coating was conducted on the washed substrate. The PAH-coated substrate was baked at 150° C. for 10 minutes, and then the nanoparticles contained in the Tris buffer solution were arranged on the substrate.

The coated substrate was dipped in the nanoparticle dispersion having a pH of 7.8 and pulled up slowly at a rate of 1 mm/min. After the nanoparticles were arranged on the substrate by dip coating, they were spin-coated at 3,000 rpm for 30 seconds. The spin coating was conducted three times and washed using distilled water, as described in Example 3, to form a nanoparticle monolayer on the substrate.

The number density of the nanoparticles in the nanoparticle monolayer was measured by scanning electron microscopy (SEM) and the state of the nanoparticles arranged in the monolayer was observed by atomic force microscopy (AFM). The respective results are shown in FIGS. 5 and 6.

Figure 5:
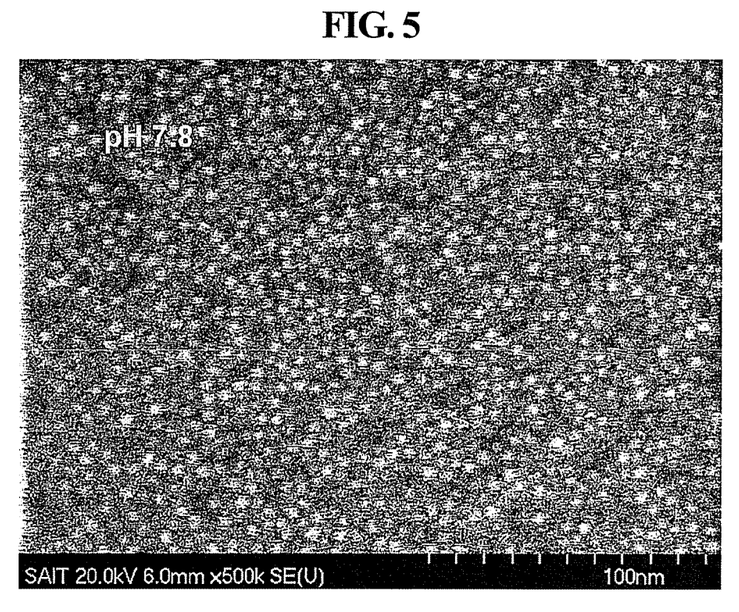
FIG. 5 is a scanning electron micrograph (SEM) showing nanoparticles arranged in a nanoparticle thin film, which is produced in Example 4 of the present invention.

FIG. 5 is a scanning electron micrograph (SEM) showing the state of the nanoparticles arranged in the nanoparticle thin film. The micrograph shows that no aggregation of the nanoparticles on the substrate was observed and the number density of the nanoparticles arranged on the substrate was about $2.1 \times 10^{12}$ nanoparticles per square centimeter (NPs/cm$^2$), which corresponds to 86% of the theoretical maximum number density of nanoparticles.

Figure 6:
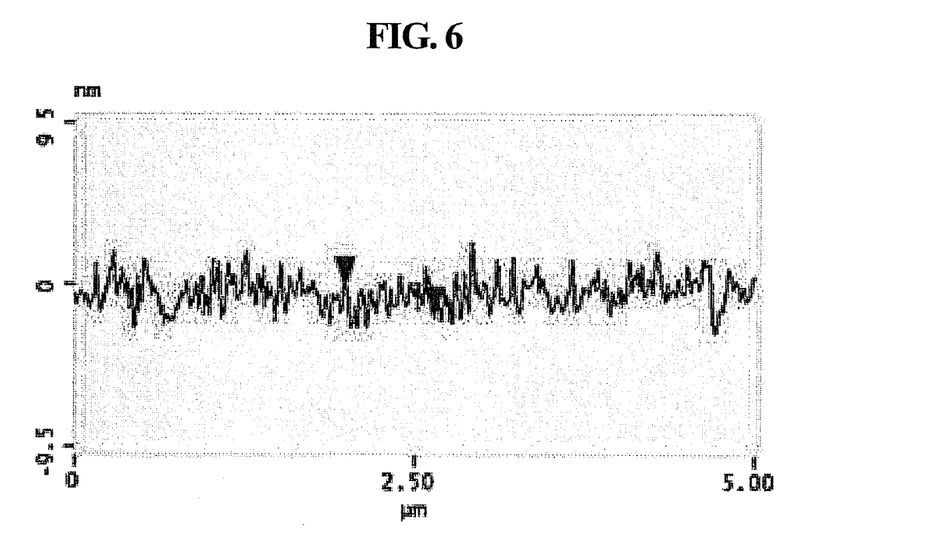
FIG. 6 is a spectrum showing a variation in the surface height of a nanoparticle thin film, which is produced in Example 4 of the present invention, as measured by atomic force microscopy (AFM), which indicates the nanoparticles arranged in the nanoparticle thin film.

FIG. 6 is a spectrum showing a variation in the surface height of the nanoparticle thin film, as measured by atomic force microscopy (AFM), which indicates a state of the nanoparticles arranged in the nanoparticle thin film. The spectrum shows that the nanoparticle thin film had a monolayer structure and a thickness of 5 nm.

EXAMPLE 5

Fabrication of Memory Device Comprising the Nanoparticle Thin Film

An organic memory test device was fabricated using the high-density nanoparticle thin film produced in Example 4 in accordance with the following procedure.

First, aluminum was deposited to a thickness of about 80 nm on a silicon (Si) wafer by thermal evaporation to form a lower electrode. A barrier layer ($Al_2O_3$) was formed to a thickness of about 1 to about 2 nm on the lower electrode by a natural oxidation process. A 10 mM aqueous solution of polyallylamine hydrochloride (PAH, $M_w$ 70,000, Aldrich) was spin-coated at 5,000 rpm on the barrier layer for 30 seconds.

The PAH-coated substrate was baked at 150° C. for 10 minutes, and then a dispersion (pH 8) of negatively charged Cu nanoparticles whose surface was modified with mercaptoacetic acid was applied thereto to form a Cu nanoparticle monolayer. A solution of poly-3-hexylthiophene (P3HT) was spin-coated on the Cu nanoparticle monolayer, followed by baking at 65° C. for 10 minutes to form a 50 nm-thick organic layer. Aluminum was deposited to a thickness of 80 nm on the organic layer by thermal evaporation to complete fabrication of the test device.

Figure 7:
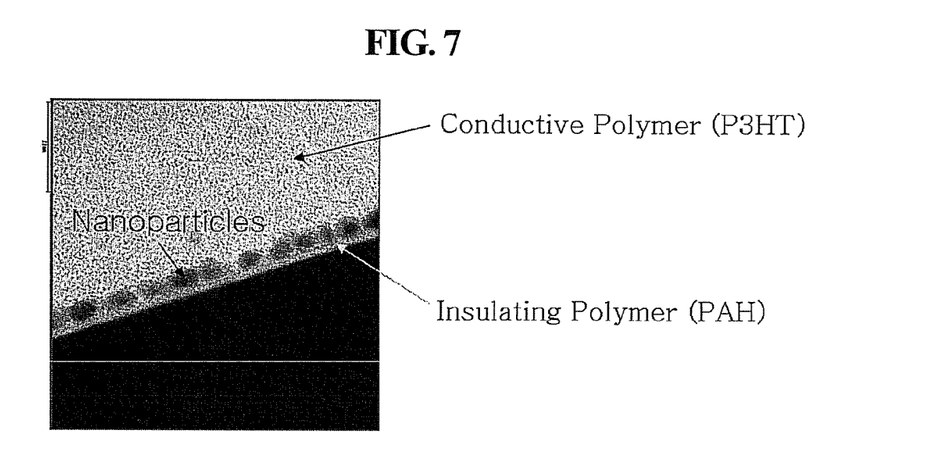
FIG. 7 is a transmission electron micrograph (TEM) of a cross-section of the organic memory device fabricated in Example 5 of the present invention.

FIG. 7 is a cross-sectional transmission electron micrograph (TEM) of the organic memory device fabricated in Example 5. The micrograph shows that the nanoparticles were formed into a high density and uniform monolayer on the Al electrode.

Figure 8:
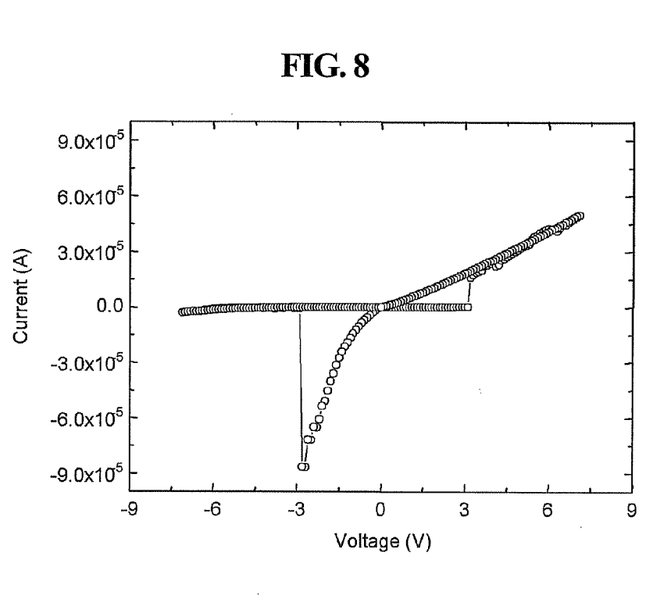
FIG. 8 is a graph showing current-voltage (C-V) characteristics of an organic memory device fabricated in Example 5 of the present invention.
Figure 9A:
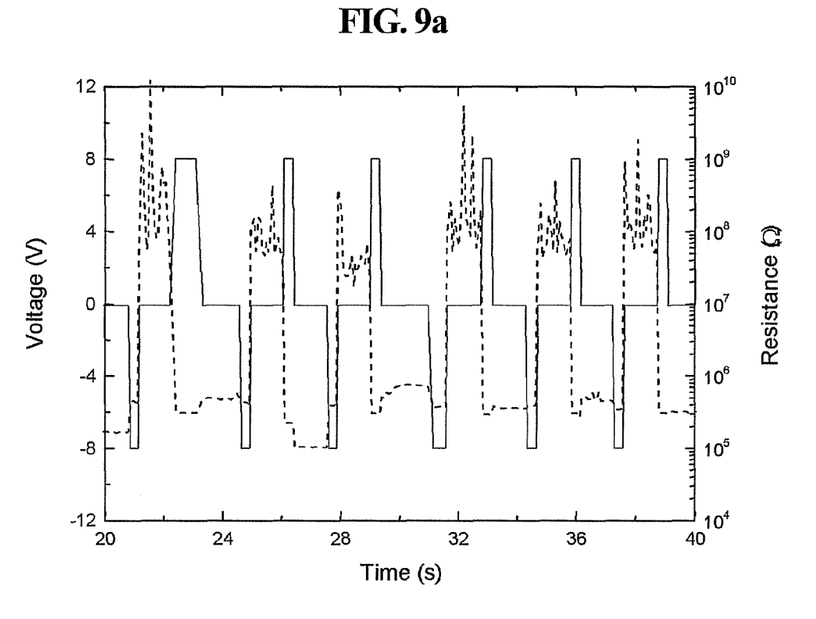
FIG. 9a is a graph showing memory characteristics of an organic memory device fabricated in Example 5 of the present invention when write (8V), read (−0.1V), erase (−8V) and read (−0.1V) pulse voltages are continuously applied to the organic memory device.
Figure 9B:
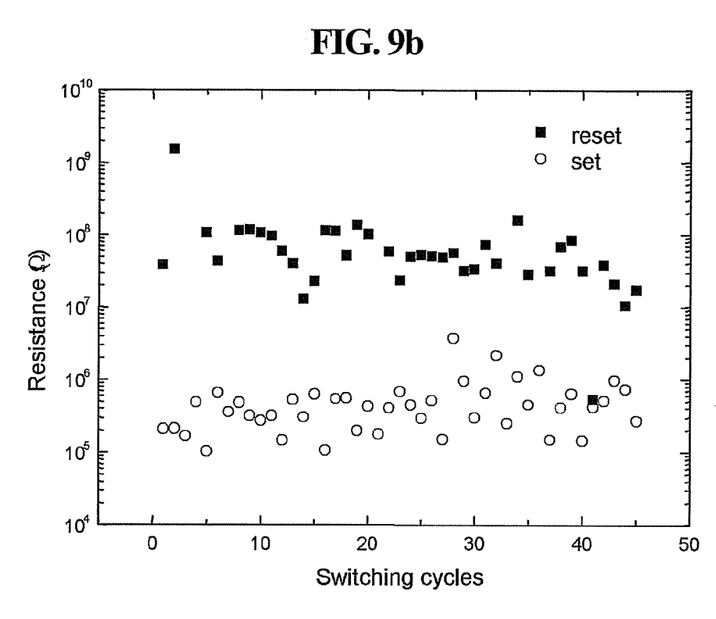
FIG. 9b is a graph showing switching characteristics of an organic memory device fabricated in Example 5 of the present invention in which low resistance values are detected when reading after write pulse voltages are applied to the memory device and these values then return to high resistance values after erase pulse voltages are applied to the memory device, indicating that the memory device shows stable switching characteristics even after 40 cycles or more of switching.

FIG. 8 is a graph showing current-voltage (C-V) characteristics of, the organic memory device. FIG. 9a is a graph showing memory characteristics of the organic memory device when write (8V), read (−0.1V), erase (−8V) and read (−0.1V) pulse voltages were continuously applied to the organic memory device, and FIG. 9b is a graph showing switching characteristics of the organic memory device in which low resistance values were detected when reading after the write pulse voltages were applied to the memory device and these values then returned to high resistance values after the erase pulse voltages were applied to the memory device, indicating that the memory device showed stable switching characteristics even after 40 cycles or more of switching.

As is apparent from the foregoing teachings, according to the present invention, the use of a pH-controlled nanoparticle dispersion to produce a nanoparticle thin film results in a reduction in the repulsive force between individual nanoparticles, leading to a high number density of the nanoparticles arranged in the nanoparticle thin film. In addition, a capillary force other than electrostatic forces is introduced during arrangement of the nanoparticles to form a high-density and uniform nanoparticle monolayer in a large area on a substrate. Furthermore, the high-density and uniform nanoparticle monolayer can be used to fabricate electronic devices, such as organic memory devices.

Although the present invention has been described herein with reference to the foregoing embodiments, these embodiments do not serve to limit the scope of the present invention. Accordingly, those skilled in the art to which the present invention pertains will appreciate that various modifications are possible, without departing from the technical spirit of the present invention.

What is claimed is:

1. A method for producing a nanoparticle thin film, comprising:

modifying the surface of nanoparticles to form surface-modified particles;

wherein the surface of the nanoparticles are electrically charged by exchanging nonpolar capping molecules on the surface of the nanoparticles for charged materials;

dispersing the surface-modified nanoparticles in a buffer solution and removing nanoparticle aggregates therefrom;

after the removal of the nanoparticle aggregates, dispersing the surface-modified nanoparticles in a solvent to form a nanoparticle dispersion;

adjusting the pH of the nanoparticle dispersion to a range of 7 to 9 to form a pH controlled nanoparticle dispersion; and arranging the nanoparticles contained in the pH-controlled nanoparticle dispersion on a substrate bearing a charge opposite to those of the surface modified nanoparticle by dip coating to utilize a capillary force, thereby forming a nanoparticle monolayer on the substrate, wherein the buffer solution is tris(hydroxymethyl)aminomethane buffer.

2. The method according to claim 1, wherein the surface modification is performed at a reaction temperature of about 25 to about 200° C. for about 0.5 to about 10 hours.

3. The method according to claim 1, wherein the charged material is selected from the group consisting of compounds having an amino group, a carboxylic group, a mercapto group and a phosphine group and having negative or positive charge.

4. The method according to claim 1, wherein before being dispersed in the buffer solution, the surface modified nanoparticles are dried in ambient air or under vacuum.

5. The method according to claim 1, wherein the nanoparticles are negatively charged, the buffer solution has a pH greater than 7, and the substrate is positively charged.

6. The method according to claim 1, wherein the substrate is pretreated by washing the substrate and adsorbing a functional group on the surface of the washed substrate.

7. The method according to claim 6, wherein the substrate is pretreated to have a coating of polyallylamine hydrochloride.

8. The method according to claim 1, wherein the nanoparticles are selected from the group consisting of Group II-IV compound semiconductor particles, Group III-V compound semiconductor particles, Group IV-VI compound semiconductor particles, Group IV compound semiconductor particles, metal particles, magnetic particles, metal oxide nanoparticles and a combination comprising at least one of the foregoing particles.

9. The method according to claim 1, wherein the pH of the nanoparticle dispersion is adjusted to a range of about 7 to about 8.

10. The method according to claim 1, wherein the solvent is selected from the group consisting of water, polar solvents, and a tris buffer solution.

* * * * *